(12) United States Patent
Ishihara

(10) Patent No.: US 9,529,376 B2
(45) Date of Patent: Dec. 27, 2016

(54) ELECTRIC POWER DETECTION SYSTEM

(71) Applicant: DENSO CORPORATION, Kariya, Aichi-pref. (JP)

(72) Inventor: Toshiro Ishihara, Kariya (JP)

(73) Assignee: DENSO CORPORATION, Kariya (JP)

( * ) Notice: Subject to any disclaimer, the term of this patent is extended or adjusted under 35 U.S.C. 154(b) by 1065 days.

(21) Appl. No.: 13/687,034

(22) Filed: Nov. 28, 2012

(65) Prior Publication Data

US 2013/0200875 A1 Aug. 8, 2013

(30) Foreign Application Priority Data

Feb. 2, 2012 (JP) .................................. 2012-20876

(51) Int. Cl.
*G01N 27/416* (2006.01)
*G05F 3/02* (2006.01)
*G01R 21/127* (2006.01)

(52) U.S. Cl.
CPC ............... *G05F 3/02* (2013.01); *G01R 21/127* (2013.01)

(58) Field of Classification Search
CPC ............................. H02J 7/345; G01R 31/3648
USPC .......................................... 320/166; 324/428
See application file for complete search history.

(56) References Cited

U.S. PATENT DOCUMENTS

| | | | | |
|---|---|---|---|---|
| 6,049,210 A | * | 4/2000 | Hwang | .............. G01R 31/3648 320/134 |
| 6,157,170 A | * | 12/2000 | Noda | ................. G01R 31/3648 320/130 |
| 6,339,315 B1 | | 1/2002 | Castelli | |
| 8,901,891 B2 | * | 12/2014 | Inoue | ..................... G01R 19/14 320/132 |
| 2011/0078092 A1 | * | 3/2011 | Kim | .................... B60L 11/1824 705/412 |

FOREIGN PATENT DOCUMENTS

| | | |
|---|---|---|
| JP | 2004-196060 A | 7/2004 |
| JP | 2006-64627 A | 3/2006 |
| JP | 2006-184035 A | 7/2006 |
| JP | 2006-185355 A | 7/2006 |

OTHER PUBLICATIONS

Office action mailed Nov. 15, 2014 in the corresponding CN application No. 201310032865.1 (and English translation).
Office action mailed Mar. 31, 2015 in the corresponding JP application No. 2012-020876 (and English translation).

* cited by examiner

*Primary Examiner* — Richard Isla Rodas
*Assistant Examiner* — Johali Torres Ruiz
(74) *Attorney, Agent, or Firm* — Posz Law Group, PLC

(57) ABSTRACT

An integration circuit charges a capacitor by a charge current corresponding to a current flowing in a detection resistor provided in an electric power supply path extending to a DCM. A comparison circuit outputs a comparison signal, which changes to one of a high level and a low level in accordance with an integration value corresponding to a charge voltage of the capacitor. A discharge switch discharges the capacitor and stops discharge of the capacitor, when the comparison signal is at the high level and the low level, respectively. A control circuit determines an estimation value of electric power supplied from a battery to a DCM based on a count of edges, at which the signal level of the detection signal changes.

9 Claims, 4 Drawing Sheets

ELECTRIC POWER DETECTION SYSTEM

CROSS REFERENCE TO RELATED APPLICATION

The present application is based on and incorporates herein by reference Japanese patent application No. 2012-20876 filed on Feb. 2, 2012.

TECHNICAL FIELD

The present disclosure relates to an electric power detection system, which detects a quantity of electric power supplied to a power supply object.

BACKGROUND

A conventional mobile device such as a notebook computer or a cellular phone, which is operated by a storage battery, becomes inoperative due to insufficient remaining battery charge (battery rundown). To avoid this situation, it is proposed to detect a remaining battery charge of a mobile device by comparing a quantity of electric power supplied from a power source to a storage battery built in the mobile device with a quantity of electric power consumed by the mobile device (for example, JP 2006-184035A).

A storage battery is also mounted in a vehicle such as an automobile to supply electric power when an engine of a vehicle is started or a quantity of electric power generation of a generator (alternator) is insufficient. It is a recent demand to output electric power from the storage battery to in-vehicle electric devices even when an ignition switch is turned off and the engine is not operated. As one example of such in-vehicle electric devices, a communication device such as a data communication module (DCM) needs continuous power supply to perform its tracking function when the vehicle is stolen.

When the battery runs down due to the continuous power supply to the in-vehicle electric devices with the engine being at rest, the engine occasionally cannot be restarted even if it need be restarted. It is therefore desired to enable detection of the remaining charge of the storage battery while the engine is at rest.

For detecting the remaining battery charge for the mobile devices, a complicated detection circuit configuration is needed since the remaining battery charge is detected by comparison of electric power supplied to the battery with electric power consumed by the electric devices. In case that the remaining battery charge is detected while the engine of the vehicle is at rest, it is desired to simplify the circuit configuration and reduce the power consumption.

SUMMARY

It is therefore an object to provide an electric power detection system, which is capable of reducing electric power consumption in a simple configuration.

According to one aspect of an electric power detection system, a detection resistor, an integration part, a comparison part a discharge part and an electric power control part are provided. The detection resistor is provided in an electric power supply path leading to a monitor object. The integration part includes a capacitive element and charges the capacitive element by a charge current corresponding to a detection current, which corresponds to a current flowing in the detection resistor. The comparison part outputs a detection signal, which changes based on an integration value corresponding to a charge voltage of the capacitive element. The detection signal changes to a first signal level and a second signal level when the integration value becomes greater than a predetermined first reference value and less than a predetermined second reference value, respectively. The discharge part discharges the capacitive element and stops discharge of the capacitive element, while the detection signal is at the predetermined first signal level and at the predetermined second signal level, respectively. The electric power control part determines an estimation value of electric power for the monitor object based on a result of counting edges, at which a signal level of the detection signal changes.

BRIEF DESCRIPTION OF THE DRAWINGS

The above and other objects, features and advantages will become more apparent from the following detailed description made with reference to the accompanying drawings. In the drawings.

EMBODIMENT OF PREFERRED EMBODIMENT

An electric power detection system will be described below with reference to one embodiment shown in the accompanying drawings.

<Overall Configuration>

Figure 1:
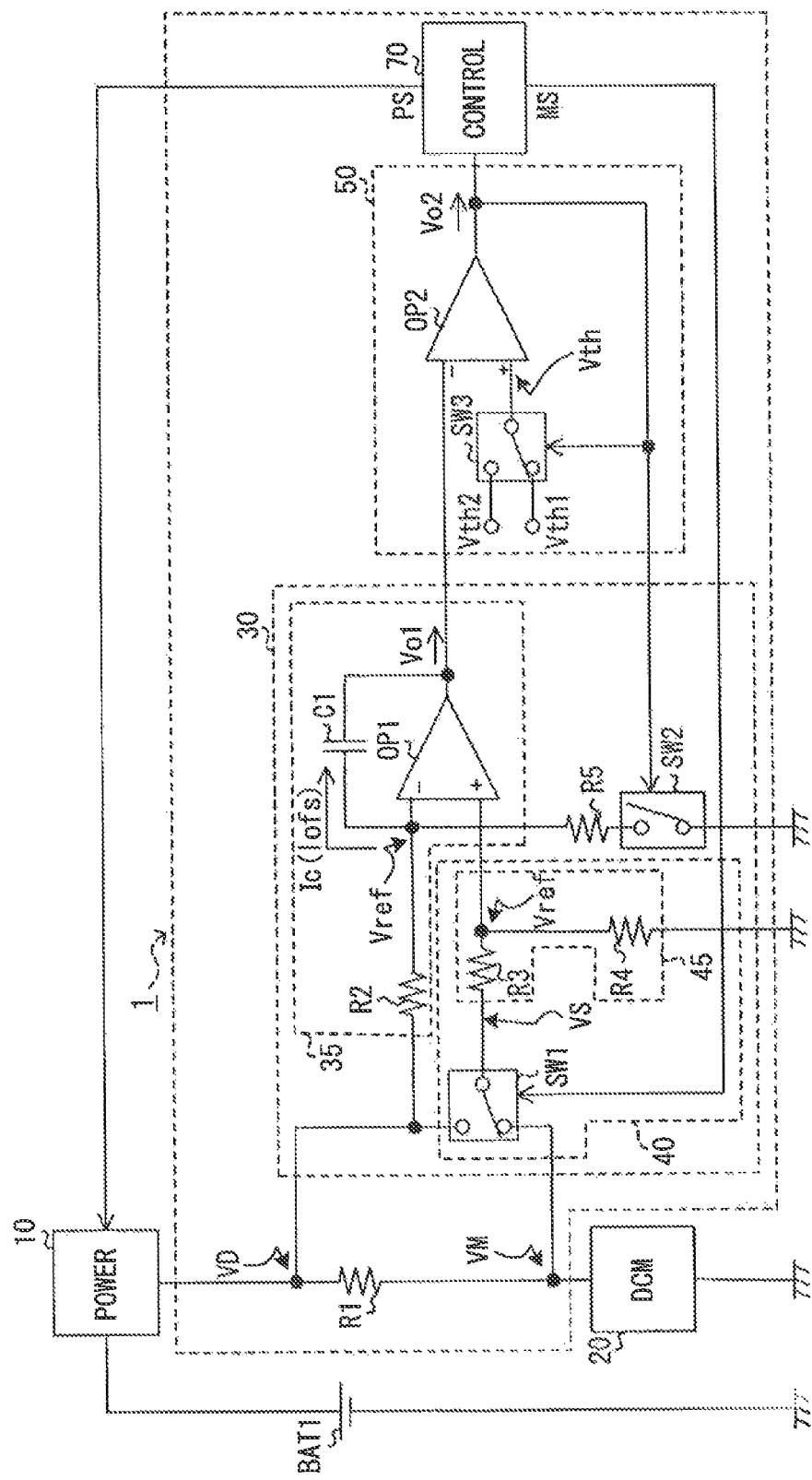
FIG. 1 is a circuit diagram showing an electric power detection system according to one embodiment.

Referring first to FIG. 1, a power detection system 1 is provided for an apparatus, which monitors and detects electric power supplied from an in-vehicle storage battery BAT1 to an in-vehicle data communication module (DCM) 20 having a function of radio communication with external communication devices (not shown). The DCM 20 is applied to a system, to which electric power is supplied from the battery BAT1 through an electric power source circuit 10 including a DC/DC converter (not shown).

The power detection system 1 includes a detection resistor R1, an integration circuit 30, a comparison circuit 50 and a control circuit 70. The detection resistor R1 is provided in an electric power supply path connecting the power source circuit 10 and the DCM 20. The integration circuit 30 outputs an integration output voltage Vo1 corresponding to an integration value of a detection current, which corresponds to an electric current flowing in the detection resistor R1. The comparison circuit 50 outputs a comparison signal Vo2, which changes to one of a high level and a low level based on a value of the integration output voltage Vo1. The control circuit 70 outputs an operation mode setting signal MS, which sets the integration circuit 30, and an electric power stop signal PS, which stops electric power supply to the DCM 20 from the power source circuit 10.

<Comparison Circuit>

In the comparison circuit 50, a second operational amplifier OP2 is provided to operate as a comparator by receiving the integration output voltage Vo1 at its inverting input terminal (−) and a predetermined threshold voltage Vth at its non-inverting input terminal (+).

In the comparison circuit 50, a threshold change-over switch SW3 selects either one of a predetermined first threshold voltage Vth1 and a predetermined second threshold voltage Vth2 based on the comparison signal Vo2 and outputs the selected one as the threshold voltage Vth. The first threshold voltage Vth1 is set to be less than the second threshold voltage Vth2.

The comparison signal Vo2 thus takes the low level and the high level when the integration output voltage Vo1 is greater than and less than the threshold voltage Vth, respectively. The threshold change-over switch SW3 is configured to select the first threshold voltage Vth1 and the second threshold voltage Vth2 when the comparison signal Vo2 is at the low level and the high level, respectively.

<Integration Circuit>

In the integration circuit 30, an integrator 35 includes a first operational amplifier OP1, which charges a capacitor C1 connected between its inverting input terminal and its output terminal by a current supplied to the inverting input terminal through a current conversion resistor R2.

In the integration circuit 30, a discharge switch SW2 is connected at its one end to the inverting input terminal of the first operational amplifier OP1 through a resistor R5 and at is other end connected to the ground. The discharge switch SW2 is switchable to an on-state or off-state in accordance with the comparison signal Vo1 In the integration circuit 30, a voltage generation circuit 40 is configured to generate a reference voltage Vref, which is supplied to the non-inverting input terminal of the first operational amplifier OP1.

The voltage generation circuit 40 includes a voltage divider circuit 45 and a change-over switch SW1. The voltage divider circuit 45 divides an input voltage applied thereto. The change-over switch SW1 switches over to either one of the power source circuit 10 side of the detection resistor R1 and the DCM 20 side of the detection resistor R1 in accordance with the operation mode setting signal MS applied thereto.

The voltage divider circuit 45 is formed of resistors R3 and R4, which are connected in series. A junction between the resistors R3 and R4 is connected to the non-inverting input terminal of the first operational amplifier OP1. The voltage applied to the voltage divider circuit 45 is divided into a divided voltage by the resistors R3 and R4. The divided voltage is applied as the reference voltage Vref to the non-inverting input terminal of the first operational amplifier OP1.

In the integration circuit 30 configured as described above, a terminal voltage Vc of the capacitor C1, which is developed across the capacitor C1, is expressed by the following equation (1) relative to the output terminal of the first operational amplifier OP1 as a reference. In this equation (1), C1 indicates a capacitance of the capacitor C1 and Ic indicates a charge current flowing in the current conversion resistor R2, $$Vc = (1/C1) \times \int Ic \, dt \quad (1)$$

The integration output voltage Vo1 is expressed by the following equation (2) based on a characteristic of an operational amplifier (imaginal shorting).

$$Vo1 = Vref - Vc \quad (2)$$

That is, the terminal voltage Vc of the capacitor C1 indicates an integration value of the charge current Ic. The integration output voltage Vo1 decreases from the reference voltage Vref as the integration value (terminal voltage Vc) increases.

The reference voltage Vref and the charge current Ic are expressed by the following equations (3) and (4), respectively. In these equations, VD indicates a voltage at the power supply side or the power source circuit 10 side of the detection resistor R1, VM indicates a voltage at the DCM 20 side of the detection resistor R1 and VS indicates a voltage (that is, VD or VM) at an output side of the change-over switch SW1. Further, K, which is R3/(R3+R4) indicates a voltage dividing ratio of the resistors R3 and R4.

$$Vref = K \times VS \quad (3)$$

$$Ic = (VD - Vref)/R2 \quad (4)$$
$$= \{(1 - K) \times VD\}/R2, \text{ (if } VS = VD) \quad (4a)$$
$$= (VD - K \times VM)/R2, \text{ (if } VS = VM) \quad (4b)$$

That is, the charge current Ic has a magnitude, which corresponds to a difference of voltages at both ends of the detection resistor R1, that is, to the detection current flowing in the detection resistor R1.

In a case that an input offset voltage Voff of the first operational amplifier OP1 is not negligible, the charge current Ic is expressed by the following equation (5) in place of the equation (4).

$$Ic = (VD - Vref + Voff)/R2 \quad (5)$$
$$= \{(1 - K) \times VD + Voff\}/R2, \text{ (if } VS = VD) \quad (5a)$$
$$= (VD - K \times VM + Voff)/R2, \text{ (if } VS = VM) \quad (5b)$$

<Operations of Integration Circuit and Comparison Circuit>

Figure 2:
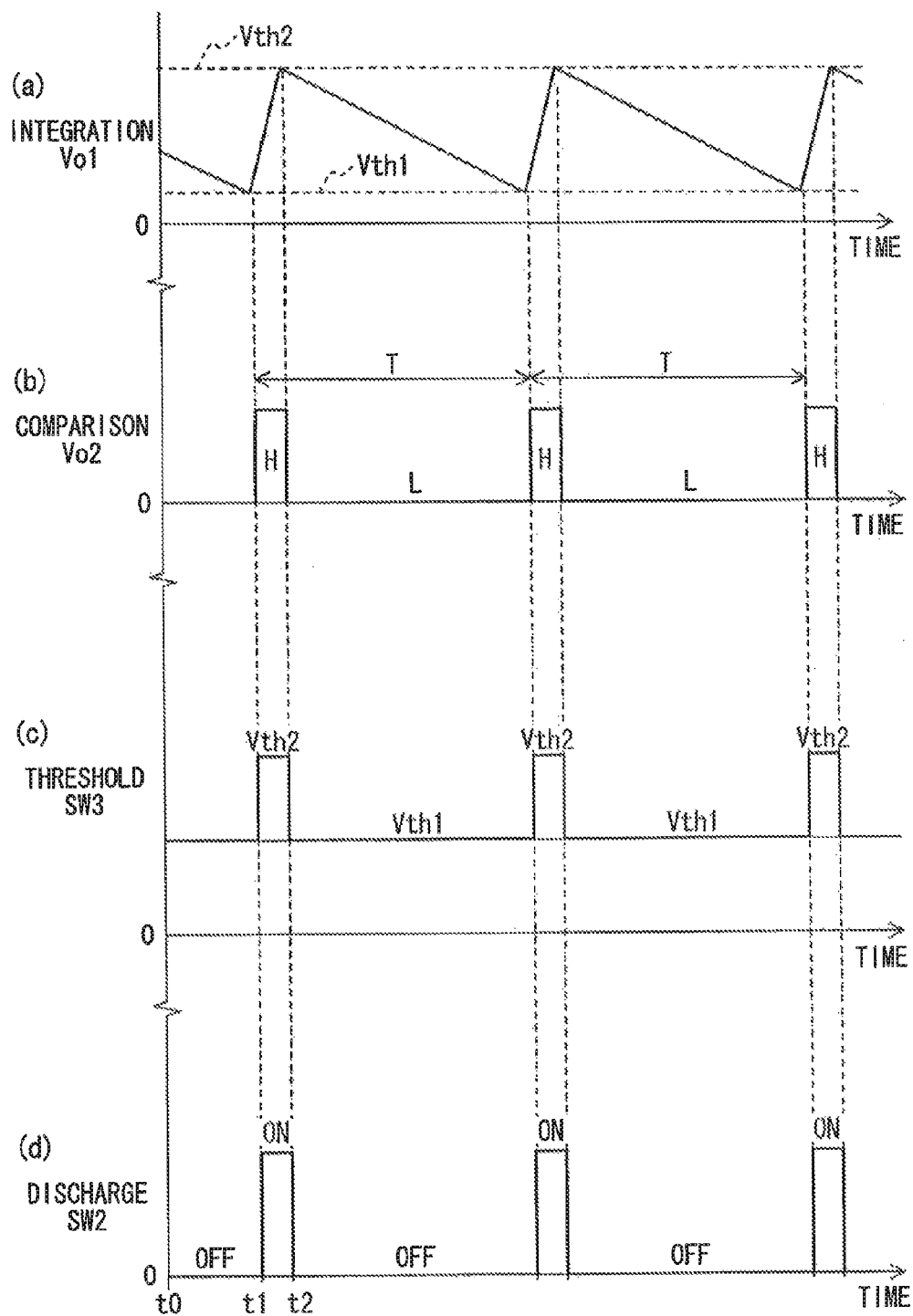
FIG. 2 is a time chart showing exemplary operations (a) to (d) of an integration circuit, a comparison circuit, a threshold change-over switch and a discharge change-over switch, respectively.

Operations of various parts in the power detection system 1 is shown in FIG. 2. In this figure, (a), (b), (c) and (d) show the integration output voltage Vo1, the comparison signal Vo2, the switch state of the threshold change-over switch SW3 and the switch state of the discharge switch SW2, respectively.

<Normal Operation Mode>

It is assumed first that the DCM 20 side of the detection resistor R1 is selected by the change-over switch SW1, that is VS=VM. This is referred to as a normal operation mode.

At time t0, the comparison signal Vo2 is at a low level, the threshold voltage Vth is set to the first threshold voltage Vth1 and the discharge switch SW2 is set to the off-state, so that the integrator 35 performs its integration operation. Thus, the integration output voltage Vo1 decreases at a rate corresponding to the magnitude of the charge current Ic, which is a detection current.

At time t1, the integration output voltage Vo1 decreases to the first threshold voltage Vth1 (Vo1<Vth1), that is, although not shown, the terminal voltage Vc of the capacitor C1 becomes greater than a predetermined first reference value. At this time, the comparison signal Vo1 changes to a high level. In response to this high level comparison signal Vo2, the threshold change-over switch SW3 changes to the second threshold voltage Vth2 side and the discharge switch SW2 changes to the on-state. As a result, the electric charge stored in the capacitor C1 by integration is discharged to the ground through the resistor R5 and the terminal voltage Vc of the capacitor C1 decreases. The integration output voltage Vo1 increases according to equation (1).

At time t2, the integration output voltage Vo1 increases to the second threshold voltage Vth2 (Vo1>vth2), that is, although not shown, the terminal voltage Vc of the capacitor C1 becomes less than a predetermined second reference value. At this time, the comparison signal Vo2 changes to the low level. In response to this low level comparison signal Vo2, the threshold change-over switch SW3 changes to the first threshold voltage Vth1 side and the discharge switch SW2 changes to the off-state. As a result, the capacitor C1 is charge and the integration output voltage Vo1 decreases at a rate corresponding to the magnitude of the charge current Ic.

The similar operation is repeated thereafter. As shown by (a) in FIG. 2, the integration output voltage Vo1 thus increases and decreases in a triangular or sawtooth waveform between the first threshold voltage Vth1 and the second threshold voltage Vth2. As shown by (b) in FIG. 2, the comparison signal Vo2 is at the high level H, while the integration output voltage Vo1 increases from the first threshold voltage Vth1 to the second threshold voltage Vth2, that is, while the charge of the capacitor C1 is discharged. The comparison signal Vo2 is at the low level L, while the integration output voltage Vo1 decreases from the second threshold voltage Vth2 to the first threshold voltage Vth1, that is, while the capacitor C1 is charged. The comparison signal Vo2 is thus a pulse signal, which causes charging and discharging alternately.

If the current flowing in the detection resistor R1 is constant and unchanged, that is, the power consumption of the DCM 20 is constant, the pulse interval T of pulse generation, at which a pulse is outputted as the comparison signal Vo2, is unchanged. The interval T between two high level pulses (pulse interval T) increases and decreases as the power consumption of the DCM 20 decreases and increases, respectively.

That is, a total quantity of power consumption in the DCM 20 can be estimated by measuring the number of generations of the pulse in a predetermined time interval by the control circuit 70.

<Offset Measurement Mode>

It is assumed next that the power circuit 10 side of the detection resistor R1 is selected by the change-over switch SW1. This is referred to as an offset measurement mode.

That is, the offset measurement mode corresponds to a case (stationary state), in which no current flows in the detection resistor R1. The charge current Ic, which flows at this time is referred to as an offset current Ioff. The magnitude of this offset current Ioff is expressed by the equation (5a).

It is assumed here that the voltage divider circuit 45 is not provided in the voltage generation circuit 40. In this case, the offset current Ioff is expressed by the following equation with K=1.

$$I_{off} = V_{off}/R2 \quad (6)$$

Since the input offset voltage Voff is an extremely small value in comparison to the voltage VD of the power circuit 10 side of the detection resistor R1, the capacitor C1 needs a long time period to be charged in case that the voltage generation circuit 40 has no voltage divider circuit. As a result, the pulse interval T becomes longer.

Since the magnitude of the offset current Ioff can be set arbitrarily with the voltage division ratio K (0<K<1) in a case that the voltage generation circuit 40 has the voltage divider circuit 45, the pulse interval T of the comparison signal Vo2 and hence the time period required for the control circuit 70 to detect the offset current Ioff can be shortened.

The magnitude of the offset current Ioff and the magnitudes of parameters (voltage division ratio K, capacitance C1 of capacitor C1, current conversion resistor R2 and resistor R5), which determines the discharge time period of the capacitor C1, may be set to magnitudes, which assure accuracy required for processing by the control circuit 70.

<Control Circuit>

The control circuit 70 is generally formed of a microcomputer, which includes a CPU, a ROM, a RAM, a flash memory, a timer and the like. The control circuit 70 includes at least two self-running timers, which operate in correspondence to a system clock. This timer is referred to as a time counter.

The CPU is configured to be interrupted by the comparison signal Vo2. When the CPU is interrupted, it performs at least interrupt processing and electric power supply control processing. The CPU sets an edge detection flag F to F=1 in the interrupt processing. The CPU controls, in the power supply control processing, an electric power supply state for the DCM 20 based on a result of estimation of a quantity of electric power supply to the DCM 20 based on the state (1 or 0) of the edge detection flag F.

<Electric Power Supply Control Processing>

Figure 3:
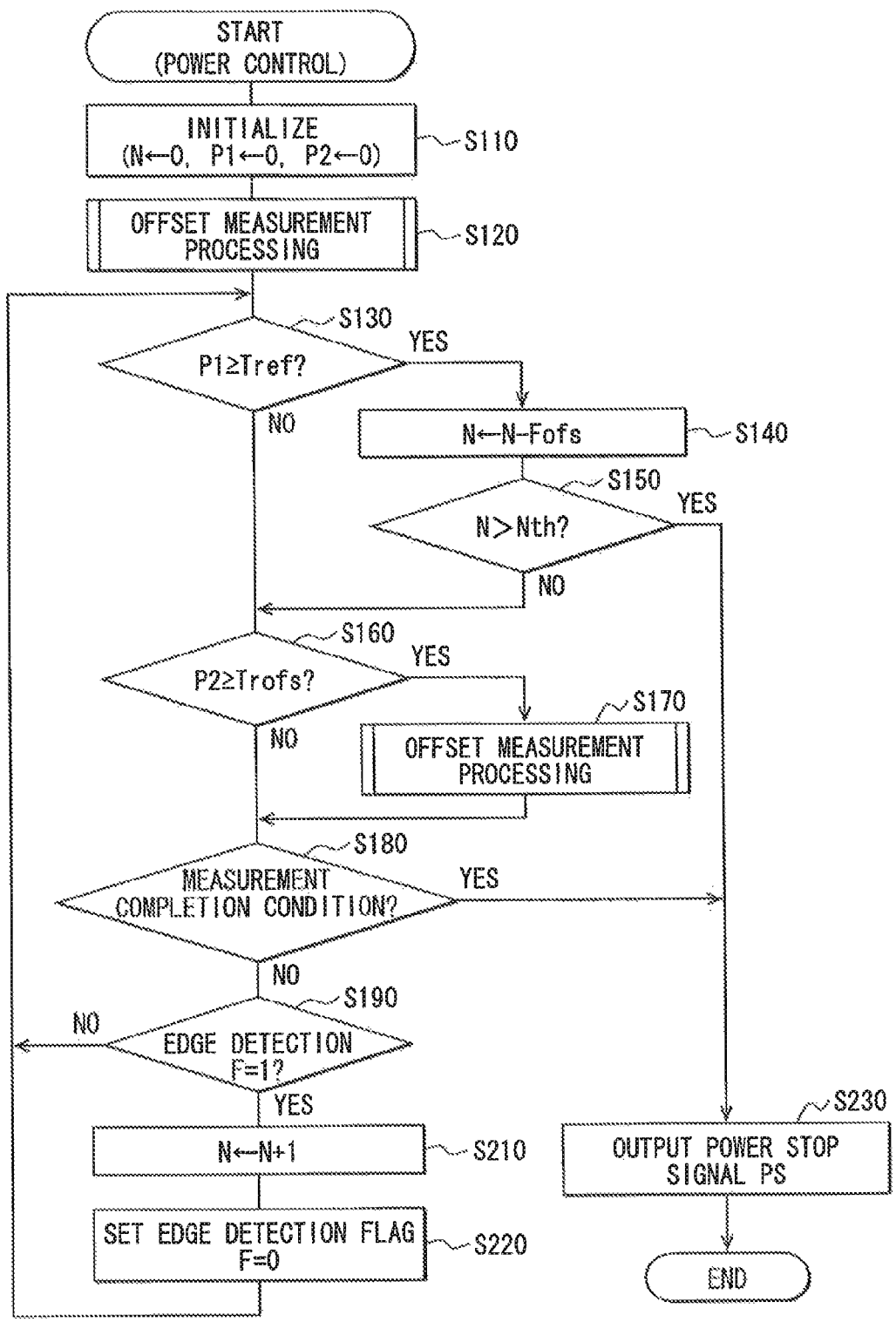
FIG. 3 is a flowchart showing electric power supply control processing executed in the embodiment.

The electric power supply control processing will be described with reference to a flowchart shown in FIG. 3. This power supply control processing is started when a driver performs a predetermined operation for stopping an engine.

At step 110 (step is simply indicated as S below), an initialization is executed to initialize various parameters used in this processing. Specifically, a pulse count number N indicating the number of pulses generated in the comparison signal Vo2 (number of setting the edge detection flag F to 1 by interrupt processing) as well as time count values P1 and P2 of the two time counters (elapsed times) are reset to zero (N←0, P1←0, P2←0). In addition, a measurement reference time period Tref, an offset re-measurement time period Trofs and a pulse upper limit value Nth, which are stored as predetermined constants in the ROM, are retrieved.

At S120, the offset measurement processing is executed thereby to calculate an offset pulse generation frequency Fofs from the comparison signal Vo2 detected when no detection current flows. The frequency Fofs indicates the number of times of generation of pulses in the measurement reference time period Tref At S130, it is checked whether the elapsed time period P1 is equal to or longer than the measurement reference time period Tref. When it is determined that the elapsed time period P1 is equal to or longer then the measurement reference time period Tref (S130:YES), the pulse count number N is updated and the elapsed time period P1 is reset to zero. In updating the pulse count number N, the pulse count number N is set to a value determined by subtracting the offset pulse generation frequency Fofs from the pulse count number N. That is, the pulse count number N is corrected by the offset pulse generation frequency Fofs at every measurement reference time period Tref.

At S150, it is checked whether the pulse count number N is greater than the pulse upper limit value Nth. When it is determined at S150 that the pulse count number N is less than the pulse upper limit value Nth (S150:NO) or determined at S130 that the elapsed time period P1 is shorter than the measurement reference time period Tref (S130:NO), S160 is executed.

At S160, it is checked whether the elapsed time period P2 is equal to or longer than the offset re-measurement time period Trofs. When it is determined that the elapsed time P2 is shorter than the offset re-measurement time period Trofs (S160:NO), 5180 is executed. When it is determined that the elapsed time period P2 is equal to or longer than the remeasurement time period Trofs (S160:YES), the elapsed time period P2 is reset to zero at S170. At the same time, the offset measurement processing is executed in the similar manner as S120, and then S180 is executed. That is, the offset pulse generation frequency Fofs is updated at every offset re-measurement time period Trofs.

At S180, it is checked whether the power measurement completion condition is satisfied. This electric power measurement completion condition includes at least that the engine is in operation. When the power measurement completion condition is not satisfied, that is, the engine is stopped continuously (S180:NO), it is checked at S190 whether the edge detection flag F is set (F=1).

When it is determined at S190 that the edge detection flag F is not set (S190:NO), S130 is executed again. When it is determined that the edge detection flag F is set (S190:YES), the pulse count number N is incremented at S210 and the edge detection flag F is reset to zero at S220, which is followed by S130.

When it is determined at S150 that the pulse count number N is greater than the pulse upper limit value Nth (S150:YES) or determined at S180 that the power measurement completion condition is satisfied (S180:YES), S230 is executed.

At S230, an electric power stop signal PS is generated to stop electric power supply to the DCM 20 by the power circuit 10. After S230, the power supply control processing is finished. In this processing, a series of processing from S130 to S220 is repeated from when the engine is stopped to when the power measurement completion condition (engine starting in this embodiment) is satisfied. Thus, it is monitored whether the pulse count number N detected by the comparison signal Vo2 exceeds the pulse upper limit value Nth. When the pulse count number N exceeds the pulse upper limit value Nth, the power stop signal PS is outputted thereby to stop the power supply of the power source circuit 10 is stopped.

<Offset Measurement Processing>

Figure 4:
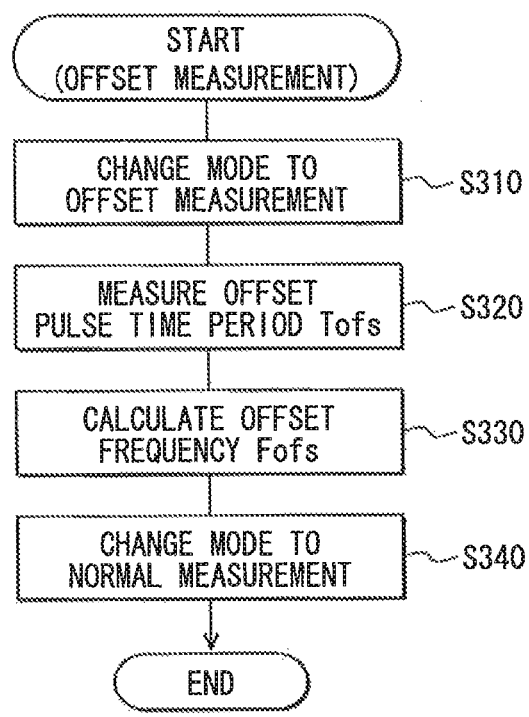
FIG. 4 is a flowchart showing offset measuring processing executed in the embodiment.

The offset measurement processing executed at S120 and S170 will be described in detail with reference to a flowchart shown in FIG. 4.

When this processing is started, at S310, an operation mode setting signal MS is outputted and the change-over switch SW1 is switched over to the offset measurement mode. At S320, the interval between generations of the interrupt to the CPU by the comparison signal Vo2 is measured by the timer. This interval is referred to as an offset pulse time period Tofs.

At S330, the offset pulse generation frequency Fofs is calculated based on the offset pulse time period Tofs measured at S320. This frequency Fofs indicates how often the pulse is generated in the measurement reference time period Tref, which is the predetermined time period. The offset pulse generation frequency Fofs is expressed by the following equation.

$$Fofs=Tref/Tofs \quad (7)$$

At S340, the operation mode setting signal MS is outputted to switch over the change-over switch SW1 to set up a normal measurement mode. That is, the offset pulse generation frequency Fofs calculated in this processing indicates an error, which is caused by influence of the offset current Ioff and arises in the estimated value of the power supplied to the DCM 20 during the measurement reference time period Tref.

Figure 5:
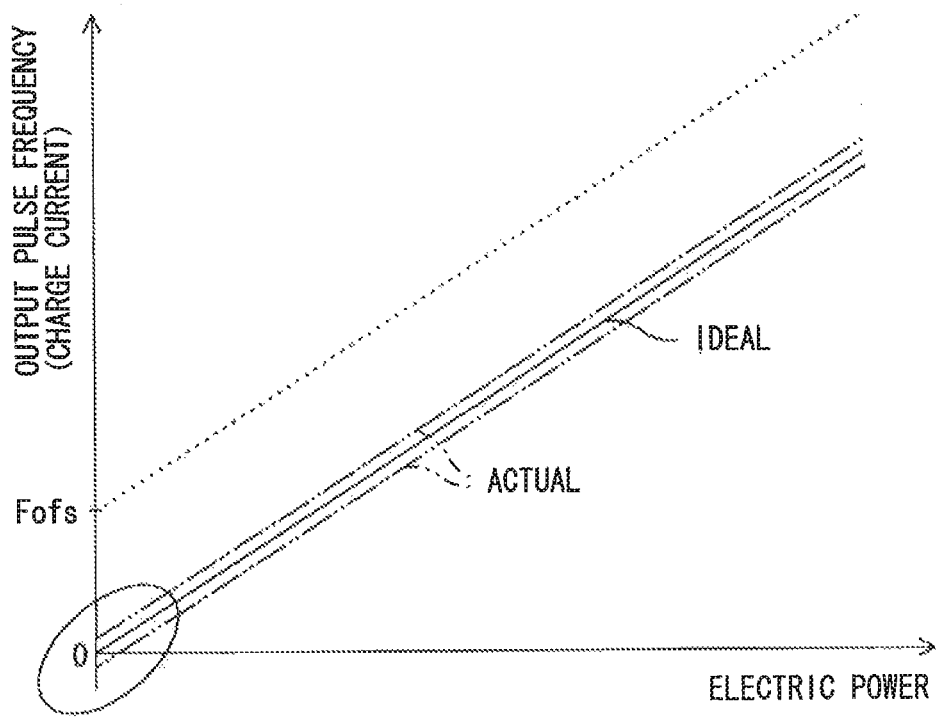
FIG. 5 is a characteristic chart showing a frequency of output pulses relative to supplied electric power according to the embodiment.

It is noted that, if the operational amplifier OP1 is an ideal one, which has no offset voltage, no current flows thereto when no electric power is supplied to the DCM 20 as indicated by a solid line in FIG. 5. However, in actuality, the operational amplifier OP1 has an offset voltage, which is generally a small value of about several hundreds micron volts (μV) to several millivolts (my). For this reason, the capacitor C1 is charged by the input offset voltage even when no electric power is supplied to the DCM 20 as exemplified by two-dot chain lines in FIG. 5. As a result, the pulse generation frequency (output pulse frequency) of the comparison circuit 50 does not become zero when the electric power is zero.

In the present embodiment, however, the offset pulse generation frequency Fofs is calculated as indicated in FIG. 5 and this offset pulse generation frequency Fofs is used to eliminate the influence of the offset voltage from the output pulse frequency indicated by a dotted line in FIG. 5. Further, since the offset pulse generation frequency Fofs is calculated by using the divided voltage of the voltage divider circuit 45 as the reference voltage, which can be set greater than the actual input offset voltage, the capacitor C1 is charged by a larger current then the current corresponding to the input offset voltage. As a result, the pulse generation frequency is increased and hence the pulse generation frequency can be calculated in a shorter time period.

<Advantage>

As described above, according to the electric power detection system 1 of the present embodiment, the estimated value of the power supplied to the DCM 20 is detected based on the pulse count number N indicating the number of pulses generated in the comparison signal Vo1. Since the power supplied to the DCM 20 is thus detected, the configuration can be more simplified than the conventional system and the power consumption of the electric power detection system 1 can be reduced.

Further, the power stop signal PS is outputted, when the estimated value of the power supplied from the in-vehicle battery to the DCM 20 during the engine stop period exceeds the predetermined pulse upper limit value Nth. It is thus possible to avoid excessive electric power supply from the battery BAT1 to the DCM 20. As a result, the battery BAT1 can be protected from running down.

Still further, the offset pulse generation frequency Fofs is subtracted from the pulse count number N, which is counted when the power is supplied to the DCM 20. By this correction, influence of the input offset voltage Voff can be lowered. Further the offset pulse generation frequency Fofs can be determined in a short time period.

It is noted in the above-described embodiment, that the power source circuit 10, the DCM 20, the capacitor C1, the integrator 35, the comparison circuit 50, the discharge switch SW2 and the control circuit 70 correspond to a power source, a monitor object, a capacitive element, an integration part, a comparison part, a discharge part and an electric power control part, respectively. Further, the voltage divider circuit 45 and the change-over switch SW1 correspond to a voltage division part and a voltage division change-over part, respectively.

The comparison signal Vo2, the high level of the comparison signal Vo2 and the low level of the comparison signal Vo2 correspond to a detection signal, a first signal level and a second signal level, respectively.

The terminal voltage Vc of the capacitor C1 corresponds to a charge voltage of the capacitive element and an integration value. The integration output voltage Vo1 decreases as the integration value of the charge current Ic, that is, the terminal voltage Vc of the capacitor C1, increases. The first threshold voltage Vth1, which the integration output voltage Vo1 crosses when decreasing corresponds to a first reference value. The second threshold voltage Vth2, which the integration output voltage Vo1 crosses when increasing corresponds to a second reference value.

The pulse count number N corresponds to a result of counting an edge, at which a signal level of the detection signal changes, and an estimated value of electric power supplied to a monitor object. The pulse upper limit value Nth, which the pulse count number N exceeds when increasing corresponds to a reference electric power.

The control circuit 70 forms an electric power control part and an offset electric power calculation part. The power supply control processing in FIG. 3 corresponds to processing as a function of the electric power control part. The offset measurement processing in FIG. 4 corresponds to processing as a function of the offset electric power calculation part.

[Other Embodiments]

The above-described embodiment may be modified as follows.

(a) Although the offset pulse generation frequency Fofs is updated while the engine is not operated, the power detection system 1 may be configured to determine an estimated value of electric power supplied to the DCM (monitor object) by using a stored value of an offset pulse generation frequency Fofs, which is measured in advance.

(b) Although the estimated value of the power is determined assuming that the power is supplied from the battery BAT1 to the DCM, that is, in a direction of discharge of the battery BAT1, the power detection system 1 may be configured to determine the estimation value of the power in respect of the direction of power supply to the battery based on the charge current from the external power source, that is, in respect of the direction of charging the battery, by assuming that the battery is the monitor object, which is charged by the external power source. With this configuration, the battery is protected from being charged excessively.

(c) Although the DCM is assumed to be the monitor object, the monitor object may be any device other than the DCM. The number of devices, which are monitor devices, may be plural.

(d) Although the power source circuit 10 is configured as a separate unit from the power detection system 1, the power source circuit 10 may 10 formed integrally with the power detection system 1.

(e) Although the power detection system 1 is mounted in a vehicle, the power detection system 1 may be used in any other systems, which use storage batteries.

What is claimed is:

1. An electric power detection system comprising:
   a detection resistor provided in an electric power supply path leading to a monitor object;
   an integration part including a capacitive element and charging the capacitive element by a charge current corresponding to a detection current, which corresponds to a current flowing in the detection resistor;
   a comparison part for outputting a detection signal, which changes based on an integration value corresponding to a charge voltage of the capacitive element, the detection signal changing to a first signal level and a second signal level when the integration value becomes greater than a predetermined first reference value and less than a predetermined second reference value, respectively;
   a discharge part for discharging the capacitive element and stopping discharge of the capacitive element, while the detection signal is at the predetermined first signal level and at the predetermined second signal level, respectively;
   an electric power control part for determining an estimation value of electric power for the monitor object based on a result of counting edges, at which a signal level of the detection signal changes; and
   a voltage division part for producing, as a reference voltage, a division voltage by dividing a voltage of a monitor object side of the detection resistor by plural resistors,
   wherein the integration part includes a current conversion resistor and an operational amplifier, which has an inverting input terminal, a non-inverting input terminal and an output terminal,
   the capacitive element is connected between the inverting input terminal and the output terminal,
   the inverting input terminal is connected to an electric power supply side of the detection resistor through the current conversion resistor to receive a voltage, which is produced at one end of the detection resistor connected to the inverting input terminal, without being divided when the capacitive element is charged,
   the non-inverting input terminal is connected to receive the reference voltage corresponding to the voltage of the monitor object side of the detection resistor, and
   the voltage division part generates the reference voltage to be greater than an offset voltage of the operational amplifier.

2. The power detection system according to claim 1, wherein:
   the power control part outputs an electric power stop signal, which stops electric power supply to the monitor object when the estimation value exceeds a predetermined reference electric power.

3. The power detection system according to claim 2, wherein:
   the integration part includes a current conversion resistor and an operational amplifier having an inverting input terminal and a non-inverting input terminal, the inverting input terminal being connected to an electric power supply side of the detection resistor through the current conversion resistor and the non-inverting input terminal receiving a reference voltage corresponding to a voltage of a monitor object side of the detection resistor.

4. The power detection system according to claim 3, further comprising:
   a voltage division part for producing, as the reference voltage, a division voltage by dividing a voltage of the monitor object side of the detection resistor.

5. The power detection system according to claim 4, further comprising:
   a voltage division change-over part switchable to apply either one of the divided voltage at an electric power supply side of the detection resistor and the division voltage to the non-inverting input terminal side.

6. The power detection system according to claim 5, wherein:
   the power control part includes an offset electric power calculation part;

the offset electric power calculation part calculates, as an offset electric power, an electric power estimated from a time period of the detection signal, when the voltage of the power supply side of the detection resistor is applied to the non-inverting input terminal by a change-over operation of the voltage division change-over part; and the offset electric power calculation part calculates the estimation value by subtracting the offset electric power from an electric power estimated based on the time period of the detection signal, when the division voltage is applied to the non-inverting input terminal by the change-over operation of the voltage division change-over part.

7. The power detection system according to claim 1, further comprising:
   a voltage division change-over part switchable to apply either one of the divided voltage at an electric power supply side of the detection resistor and the division voltage to the non-inverting input terminal side.

8. The power detection system according to claim 7, wherein:
   the power control part includes an offset electric power calculation part;
   the offset electric power calculation part calculates, as an offset electric power, an electric power estimated from a time period of the detection signal, when the voltage of the power supply side of the detection resistor is applied to the non-inverting input terminal by a change-over operation of the voltage division change-over part; and
   the offset electric power calculation part calculates the estimation value by subtracting the offset electric power from an electric power estimated based on the time period of the detection signal, when the division voltage is applied to the non-inverting input terminal by the change-over operation of the voltage division change-over part.

9. The power detection system according to claim 1, wherein the voltage division part includes:
   a first division resistor connected between the monitor object and the non-inverting input terminal; and
   a second division resistor connected between the non-inverting input terminal and ground.

* * * * *